United States Patent
Chang et al.

(10) Patent No.: US 7,809,092 B2
(45) Date of Patent: Oct. 5, 2010

(54) METHOD AND SYSTEM FOR UMTS HSDPA SHARED CONTROL CHANNEL PROCESSING

(75) Inventors: Li Fung Chang, Holmdel, NJ (US); Hongwei Kong, Denville, NJ (US)

(73) Assignee: Broadcom Corporation, Irvine, CA (US)

( * ) Notice: Subject to any disclaimer, the term of this patent is extended or adjusted under 35 U.S.C. 154(b) by 925 days.

(21) Appl. No.: 11/565,520

(22) Filed: Nov. 30, 2006

(65) Prior Publication Data

US 2008/0130556 A1 Jun. 5, 2008

(51) Int. Cl.
*H04L 27/22* (2006.01)
*H03D 3/22* (2006.01)

(52) U.S. Cl. .................. 375/341; 375/262; 375/265; 714/794; 714/796

(58) Field of Classification Search .............. 375/341, 375/316, 262, 265; 714/794, 796
See application file for complete search history.

(56) References Cited

U.S. PATENT DOCUMENTS

| 2004/0001428 A1 | 1/2004 | Datta et al. |
| 2005/0180344 A1 | 8/2005 | Sternberg et al. |
| 2005/0181735 A1 | 8/2005 | Hiraki et al. |
| 2006/0274639 A1* | 12/2006 | Shen et al. ................ 370/209 |

FOREIGN PATENT DOCUMENTS

| EP | 1487118 A | 12/2004 |
| KR | 1020060107589 A | 10/2006 |

OTHER PUBLICATIONS

3$^{RD}$ Generation Partnership Project; Technical Specification Group Radio Access Network; Multiplexing and Channel Coding (FDD) (Release 6) 3GPP Organisational Partners, 3GPP TS 25.212 V6.7.0 (Dec. 2005).
3$^{rd}$ Generation Partnership Project; Technical Specification Group Radio Access Network; Physical Layer Procedures (FDD) (Release 6), 3GPP TS 25.214 V6.8.0 (Mar. 2006).

(Continued)

*Primary Examiner*—Ted M Wang
(74) *Attorney, Agent, or Firm*—McAndrews, Held & Malloy

(57) ABSTRACT

Aspects of a method and system for UMTS HSDPA Shared Control Channel processing may include calculating at a receiver, for each one of a plurality of control channels, a quality metric derived from at least one Viterbi Decoder state metric. A control channel may be selected on the basis of the quality metrics, where the quality metric is selected that provides maximum confidence. The selected control channel may be chosen if its corresponding 3GPP metric is greater than a specified threshold, where the threshold is a design parameter. A validity of a selected control channel may be determined based on consistency and a CRC, where the CRC may be derived from decoding a sub-frame. The calculating and selecting may be done for a first slot of a sub-frame for High-Speed Shared Control Channels.

24 Claims, 6 Drawing Sheets

OTHER PUBLICATIONS

"Universal Mobile Telecommunications System; Physical Layer Procedures(3GPP TS 25.214 version 5.9.0 Release 5); ETSI TS 125 214" European Telecommunicaitons Standards Institute, Sophia-ANtipo, FR, vol. 3-R1, No. V590, Jun. 2004, XP014016701 ISSN: 000-0001 p. 37.

Communication pursuant to Artilce 94(3) for European Patent Application No. 07012849.1-2223, dated Feb. 2, 2010.

Universal Mobile Telecommunications System (UMTS); Multiplexing and channel coding (FDD) (3GPP TS 25.212 version 6.6.0 Release 6); ETSI TS 125 212. ETSI Standards, LIS, Sophia Antipolis Cedex, France, vol. 3-R1, No. V6.6.0, Sep. 1, 2005, XP014031912.

* cited by examiner

METHOD AND SYSTEM FOR UMTS HSDPA SHARED CONTROL CHANNEL PROCESSING

CROSS-REFERENCE TO RELATED APPLICATIONS/INCORPORATION BY REFERENCE

None.

FIELD OF THE INVENTION

Certain embodiments of the invention relate to signal processing. More specifically, certain embodiments of the invention relate to a method and system for UMTS HSDPA Shared Control Channel processing.

BACKGROUND OF THE INVENTION

Mobile communications has changed the way people communicate and mobile phones have been transformed from a luxury item to an essential part of every-day life. The use of mobile phones is today dictated by social situation, rather than by location or technology. While voice connections fulfill the basic need to communicate, and mobile voice connections continue to filter even further into the fabric of life, the mobile Internet is the next step in the mobile communication revolution. The mobile Internet is poised to become a common source of information, and easy, versatile mobile access to this data will be taken for granted.

Third generation (3G) cellular networks have been specifically designed to fulfill these future demands of the mobile Internet. As these services grow in popularity and usage, factors such as cost efficient optimization of network capacity and quality of service (QoS) will become ever more essential to cellular operators. These factors may be achieved with careful network planning and operation, improvements in transmission methods, and advances in receiver techniques. To this end, carriers need technologies that will allow them to increase downlink throughput and, in turn, offer advanced QoS capabilities and speeds that rival those delivered by cable modem and/or DSL service providers. In this regard, networks based on wideband CDMA (WCDMA) technology can make the delivery of data to end users a more feasible option for today's wireless carriers.

WCDMA has evolved continuously towards higher data rates and towards packet-switched IP-based services. The following paragraphs elaborate on the evolution to HSDPA from GPRS via EDGE.

The GPRS and EDGE technologies may be utilized for enhancing the data throughput of present second generation (2G) systems such as GSM. The GSM technology may support data rates of up to 14.4 kilobits per second (Kbps), while the GPRS technology may support data rates of up to 115 Kbps by allowing up to 8 data time slots per time division multiple access (TDMA) frame. The EDGE technology, a further enhancement to GPRS, may support data rates of up to 384 Kbps. The EDGE technology may utilizes 8 phase shift keying (8-PSK) modulation to provide higher data rates than those that may be achieved by GPRS technology. The GPRS and EDGE technologies may be referred to as "2.5G" technologies.

The UMTS technology with theoretical data rates as high as 2 Mbps, is a 3G evolution of GSM, using wideband CDMA technology. UMTS may achieve higher data rates than GSM/EDGE due to many enhancements, including higher transmission bandwidth, adaptive higher order modulation and interference averaging due to a unity frequency reuse factor.

The High-Speed Downlink Packet Access (HSDPA) technology is an Internet protocol (IP) based service, oriented towards data communications, which adapts WCDMA to support data transfer rates in the order of 14 megabits per second (Mbit/s). Developed by the 3G Partnership Project (3GPP) group, the HSDPA technology achieves higher data rates through a plurality of methods. In order to avoid excessive interference, 2G WCDMA may require fast power control to maintain a constant data rate. The HSDPA technology changes this paradigm and instead maintains a constant transmission power but may change the coding and modulation rate to adapt to changing channel conditions. Other methods that may be used to improve the data throughput are fast packet scheduling and a fast retransmission of lost packets by using Hybrid Automatic Repeat Request techniques.

The HSDPA system may consist of a High-Speed Physical Downlink Shared Channel (HS-PDSCH/HS-DSCH), which permits a plurality of users to share the high-speed data connection. Additionally, a plurality of support channels may be available to carry control and setup information. In particular, a plurality of High-Speed Downlink Shared Control Channels (HS-SCCH) may be present. These control channels may carry signaling information for the User Equipment (UE, that is the mobile terminal) and may contain information about when the UE may expect data and how the data will be encoded.

Since processing of the HS-SCCH channel takes place at the UE, these operations may be very sensitive to power consumption. However, lowering the quality of the signal processing in order to save energy, may lead to more significant power expenditure due to incorrect decisions taken. For example, this may be the case when the UE erroneously changes from stand-by mode to HS-PDSCH receiver mode based on incorrectly decoded HS-SCCH data. It is therefore important to devise methods that may lead to a minimum of errors in the decoding of the HS-SCCH and that may use a minimum of power.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for UMTS HSDPA Shared Control Channel processing, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for UMTS HSDPA Shared Control Channel processing. Aspects of a method and system may comprise calculating at a receiver, for each one of a plurality of control channels, a quality metric derived from at least one Viterbi Decoder state metric. A control channel may be selected on the basis of the quality metrics, where the quality metric is selected that provides maximum confidence. The selected control channel is chosen if its corresponding 3GPP metric is greater than a specified threshold, where the threshold is a design parameter. A validity of a selected control channel is determined based on consistency and a CRC, where the CRC may be derived from decoding a sub-frame. Calculating and selecting may be done for a first slot of a sub-frame for High-Speed Shared Control Channels.

Figure 1A:
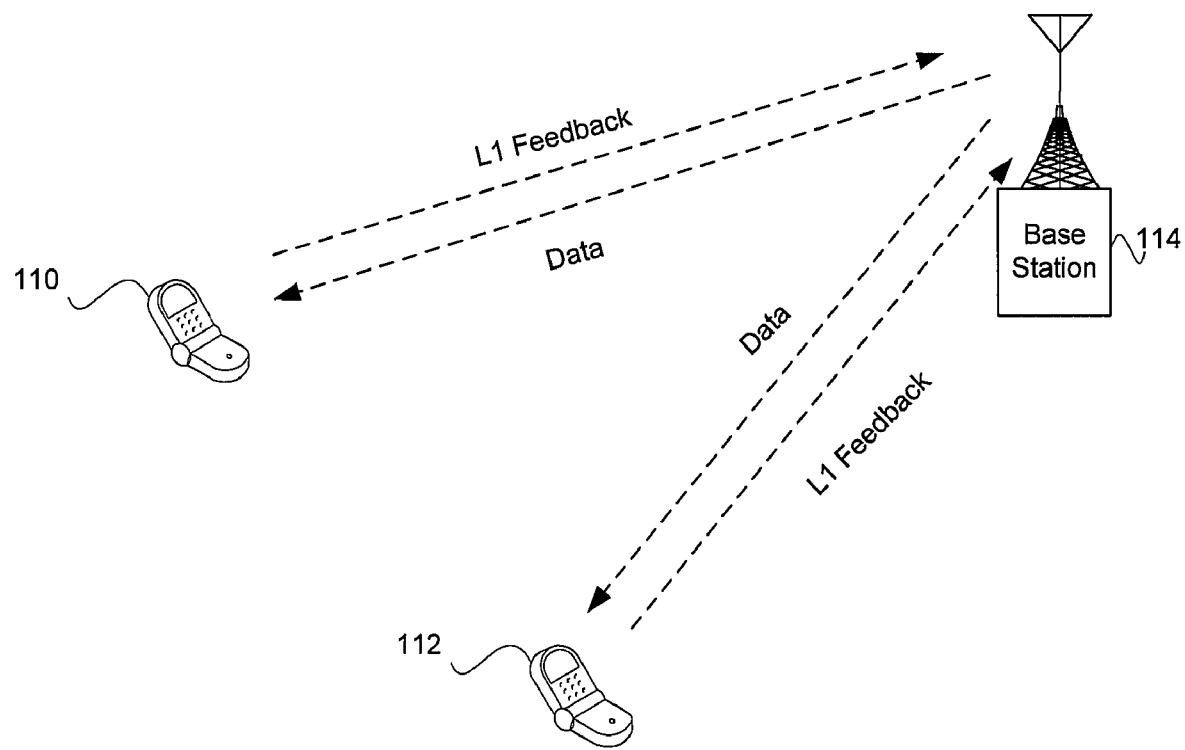
FIG. 1A illustrates an exemplary HSDPA distributed architecture that achieves low delay link adaptation, in connection with an embodiment of the invention.

FIG. 1A illustrates an exemplary HSDPA distributed architecture that achieves low delay link adaptation, in connection with an embodiment of the invention. Referring to FIG. 1A, there is shown user equipment (UE) 110 and 112 and a base station (BS) 114. There is also shown a data path, data, and a layer 1 feedback path, L1 feedback. The data path may be used to transmit payload data such as Voice or IP-data from the BS to the UE. The L1 feedback path may be used to feed back control information such as latency or channel quality from the UE to the BS.

HSDPA is built on a distributed architecture that achieves low delay link adaptation by placing key processing at the BS 114 and thus closer to the air interface than if the same processing would take place in the core network. Accordingly, the MAC layer (Layer 2) at the BS 114 is closely integrated with the Physical Layer (Layer 1), which implies that the systems may respond in a much faster manner with data access.

The HSDPA technology employs several important new technological advances. Some of these may comprise scheduling for the downlink packet data operation at the BS 114, higher order modulation, adaptive modulation and coding, hybrid automatic repeat request (HARQ), physical layer feedback of the instantaneous channel condition, and a new transport channel type known as high-speed downlink shared channel (HS-DSCH) that allows several users to share the air interface channel. When deployed, HSDPA may co-exist on the same carrier as the current WCDMA and UMTS services, allowing operators to introduce greater capacity and higher data speeds into existing WCDMA networks. HSDPA replaces the basic features of WCDMA, such as variable spreading factor and fast power control, with adaptive modulation and coding, extensive multicode operation, and fast and spectrally efficient retransmission strategies. Thus, significant gains in average data throughput rates may be obtained between the user equipment 110 and 112 and the base station 114.

Figure 1B:
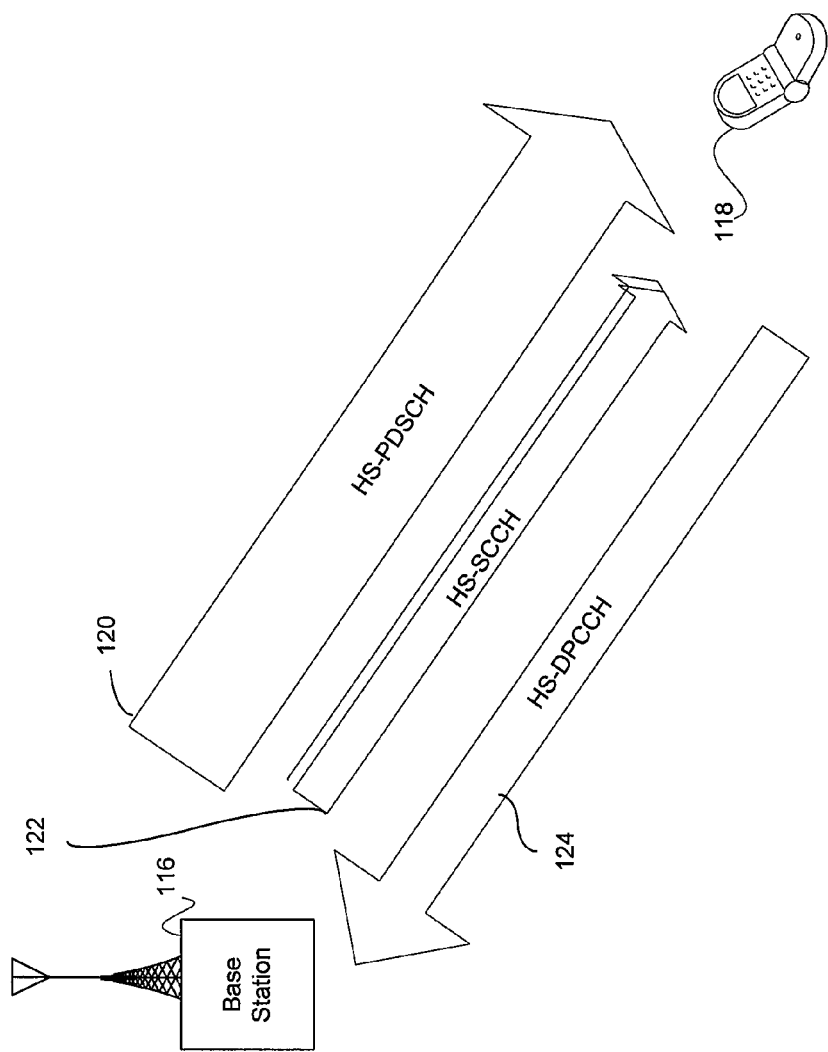
FIG. 1B is a diagram illustrating an exemplary HSDPA channel structure, which may be utilized in connection with an embodiment of the invention.

FIG. 1B is a diagram illustrating an exemplary HSDPA channel structure, which may be utilized in connection with an embodiment of the invention. Referring to FIG. 1B, there is shown a base station 116, a user equipment (UE) 118, a High-Speed Physical Downlink Shared Channel (HS-PDSCH) 120, a plurality of High-Speed Shared Control Channels (HS-SCCH) 120 and a High-Speed Dedicated Physical Control Channel (HS-DPCCH) 124. Referring to FIG. 1B, three additional channel types may be used to support a HSDPA connection between the base station 116 and the user equipment 118. A high-speed physical downlink shared channel (HS-PDSCH) 120 and a plurality of high-speed shared control channels (HS-SCCH) 122 may be used on the downlink between the base station 116 and the UE 118. A high-speed dedicated physical control channel (HS-DPCCH) 124 may used on the uplink between the UE 118 and the base station 116.

A plurality of UE 118 may share the data capacity of the HS-DSCH 120, where the data is separated both by spreading code and time slot. In order to support this function, the UE 118 may obtain control information over the HS-SCCH 122. Decoding the HS-SCCH 122 may provide the UE 118 the fast changing parameters needed for reception of the HS-PDSCH 120. In the uplink direction, there may be a HS-DPCCH 124 for sending back data packet acknowledgments and channel quality information that may be used by the BS 116 to schedule the transmissions to different UEs 118.

Like the HS-PDSCH 120, a plurality of HS-SCCH 122 channels may be shared among a plurality of UEs, whereas the HS-DPCCH 124 may be dedicated to a single UE 118. There may be up to four HS-SCCH 122 channels configured for a single UE 118, although only one may carry information from the BS 116 intended for the UE 118 at any one time. Hence, up to 4 HS-SCCH channels 122 may need to be monitored simultaneously at the UE 118.

Figure 2:
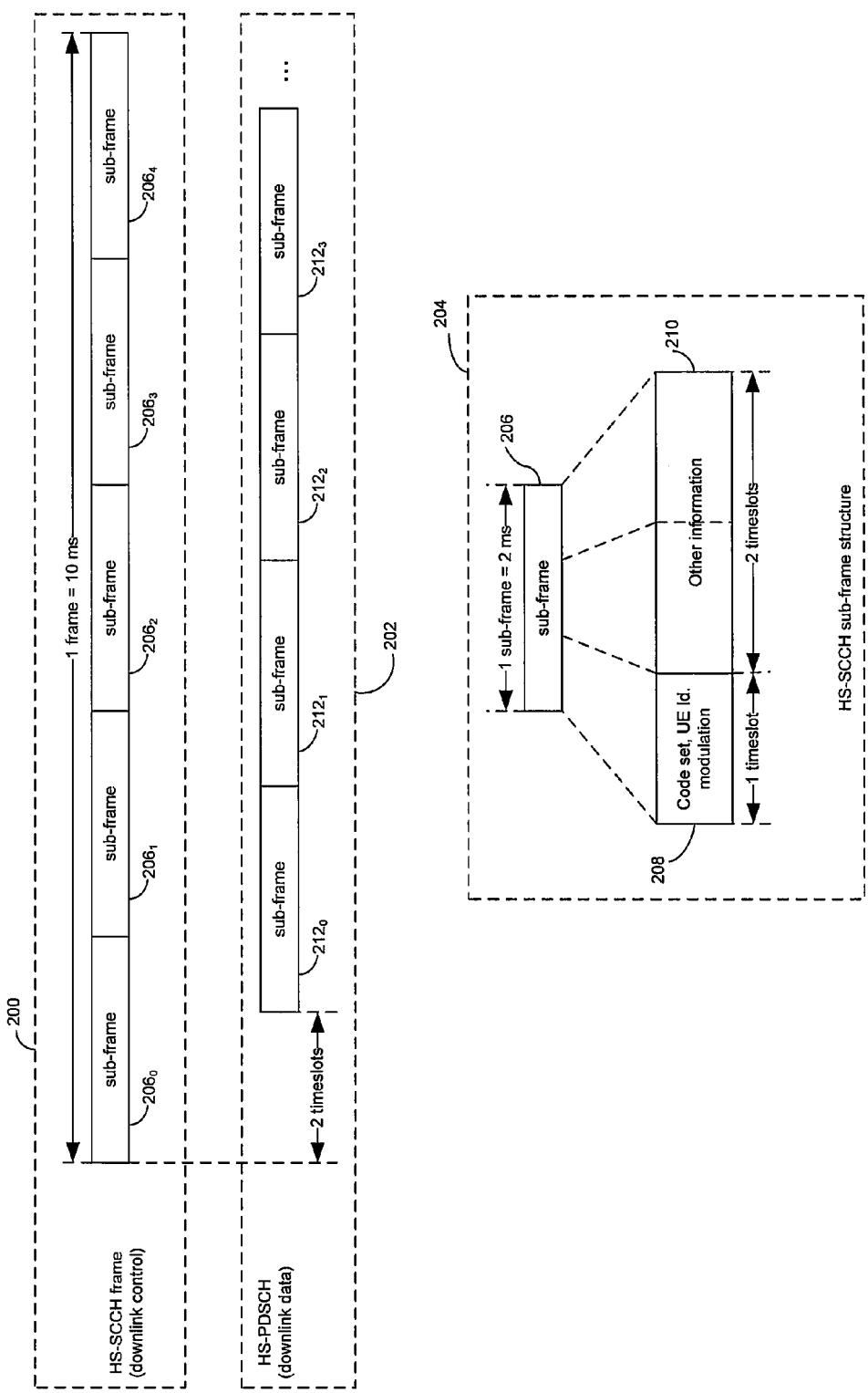
FIG. 2 is an exemplary diagram illustrating the frame structure and the timing that may be used to elaborate on the interactions between the HS-SCCH control channel and the HS-PDSCH shared downlink data channel.

FIG. 2 is an exemplary diagram illustrating the frame structure and the timing that may be used to elaborate on the interactions between the HS-SCCH control channel and the HS-PDSCH shared downlink data channel. Referring to FIG. 2, there is shown a HS-SCCH frame 200, a HS-PDSCH frame 202 and the HS-SCCH sub-frame structure 204, The HS-SCCH frame 200 comprising of 5 sub-frames, $2060_4$. The HS-PDSCH frame 202 may comprise 5 sub-frames, of which 4 sub-frames, namely $2060_{-3}$ are shown.

The structure of the HS-SCCH sub-frame 204 comprises the sub-frame 206, comprising a first timeslot 208 and a plurality of timeslots 210. The H-SCCH frame 200 and the corresponding HS-PDSCH 202 overlap by 1 timeslot, as illustrated in the first sub-frame of the HS-SCCH $206_0$ and the first sub-frame of the HS-PDSCH $212_0$. The UE may receive the HS-PDSCH data channel sub-frame $212_0$ before the end of the control sub-frame $206_0$ because the data necessary to setup receiving the HS-PDSCH sub-frame $212_0$ may be contained in the first timeslot of the HS-SCCH sub-frame $206_0$, which may comprise the UE identity, the spreading code set used and the modulation used, for example either QPSK or 16 QAM. The HS-SCCH 206 sub-frame structure in 204 may comprise a first timeslot 208 comprising the HS-PDSCH setup information, followed by two slots 210 comprising other information necessary to process the information obtained on the HS-PDSCH, such as transport block size or hybrid-ARQ information.

Since the recipient of every HS-PDSCH such as HD-PDSCH sub-frame $212_{0-3}$ may change every sub-frame, as may be signaled in the corresponding HS-SCCH sub-frames $206_{0-3}$, the receiver of the HS-SCCH control channel 200 may need to decode the first timeslot 208 of the HS-SCCH sub-frame $206_{0-3}$ and initiate the setup for receiving the corresponding HS-PDSCH sub-frame $212_{0-3}$ during the second timeslot 210. To ensure that only the UE that is addressed may decode the setup information contained in the HS-SCCH sub-frames, the data in the first timeslot 208 may be masked with a bit-string derived from the corresponding UE identity. In this manner, only the addressed UE identity may correctly decode the first time slot of the HS-SCCH sub-frame containing the setup information for the associated HS-PDSCH sub-frame.

Figure 3:
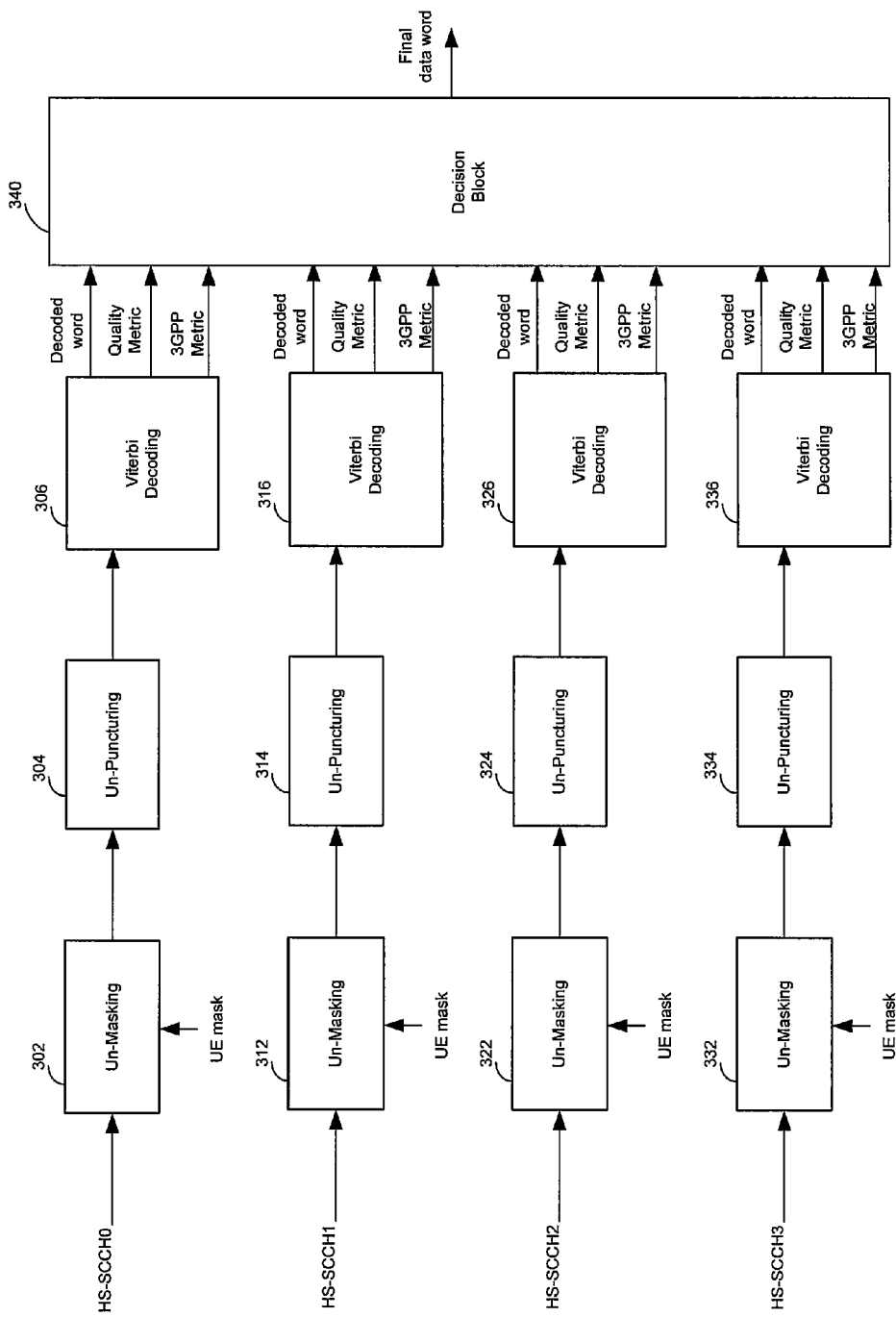
FIG. 3 is a diagram illustrating a HS-SCCH first slot receiver, in accordance with an embodiment of the invention.

FIG. 3 is a diagram illustrating a HS-SCCH first slot receiver, in accordance with an embodiment of the invention. Referring to FIG. 3, there is shown Un-masking blocks 302, 312, 322, 332, Un-Puncturing blocks 304, 314, 324, 334, Viterbi Decoders 306, 316, 326, 336 and Decision block 340.

A plurality of up to four HS-SCCH control channels may be assigned to a single UE, denoted by HS-SCCH0, HS-SCCH1, HS-SCCH2 and HS-SCCH3. Only one of the control channels, however, may carry information for a particular UE at any time. It may hence be necessary to decode all four control channels simultaneously because the UE does not know which control channel may bear the information required to set up the data-carrying HS-PDSCH channel. The processing chain may be identical for each HS-SCCH channel, that is, the blocks 302, 312, 322, 332 may be identical, as well as 304, 314, 324, 334 and 306, 316, 326, 336. The receiver chain for HS-SCCH0, which comprises Un-Masking 302, Un-Puncturing 304 and Viterbi Decoding 306, may be utilized to illustrate operation of each of the receiver chain illustrated in FIG. 3. The parallel receiver branches for HS-SCCH1, HS-SCCH2 and HS-SCCH3 may be processed identically.

The Un-masking block 302 may comprise suitable logic, circuitry and/or code that may be utilized to decode the first time slot of a sub-frame of HS-SCCH0, with reference to FIG. 2. In the absence of a matching UE mask in the first slot of a control signal HS-SCCH0, the decoded output of the Un-masking block 302 may essentially be data without meaning.

In the Un-Puncturing block 304 may comprise suitable logic circuitry and/or code that may be utilized to re-insert into the data stream entering 304, a plurality of symbols that may have been removed in the puncturing process at the transmitter. The values of these re-inserted symbols may be zero or any other appropriate values.

The data resulting from the un-Puncturing process may be communicated to the Viterbi decoder 306. The Viterbi decoder may comprise suitable logic circuitry and/or code that may be utilized to decode the error-correcting convolutional coding applied at the transmitter. The Viterbi decoder 306 may enable generation of a data word that may most likely have been transmitted. In addition, a quality metric indicating a measure of confidence in the decoded data word may be calculated.

The decoded data words and their associated quality metric from the plurality of control channel Viterbi decoders, blocks 306, 316, 326 and 336, respectively, may then be communicated to the Decision block 340. Based on the numerical value of the quality metric, the decision block 340 may then decide which HS-SCCH branch most likely (with the maximum measure of confidence) carries the information intended for the UE. The decoded data word associated with the quality metric indicating the highest confidence may be switched through and signaled at the output of the Decision block 340 as the final data word.

It may also be the case that none of the plurality of HS-SCCH contains any information intended for a given UE in a given sub-frame. To determine whether a signal carrying meaningful data may be present, the 3GPP metric associated with the Viterbi decoder corresponding to the decoded data word associated with the quality metric indicating maximum confidence, may be compared to a threshold value D in the Decision block 340. If the 3GPP metric is greater than or equal to the threshold D, a valid signal may be assumed to have been decoded. If the 3GPP metric is inferior to the threshold D, the signal decoded is assumed to have been invalid. The threshold value D is a design-parameter.

Figure 4:
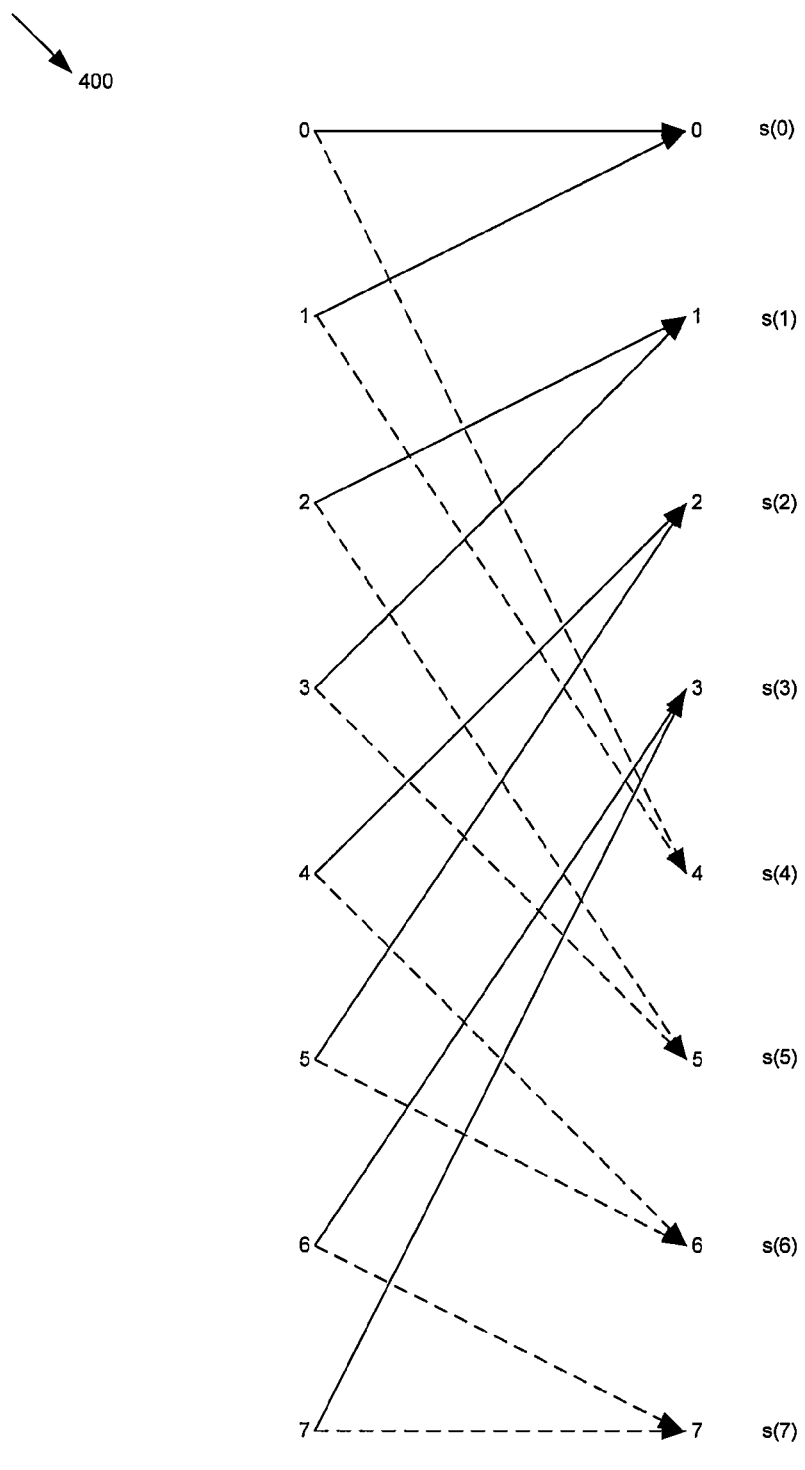
FIG. 4 shows an exemplary 8-state trellis diagram of an 8-state convolutional code Viterbi decoder, in connection with an embodiment of the invention.

FIG. 4 shows an exemplary 8-state trellis diagram of an 8-state convolutional code Viterbi decoder, in connection with an embodiment of the invention. Associated with a Viterbi decoder for an n-state convolutional code is a state metric for each of n possible states. After n soft input symbols entering the Viterbi decoder, n state metrics will be available for each of n states. The maximum metric may be defined as:

$$MaxMetric = \max_{i=\{0,1,\ldots n\}} \{s(i)\}$$

and the minimum metric may be defined as:

$$MinMetric = \min_{i=\{0,1,\ldots n\}} \{s(i)\}$$

The quality metric may be defines as:

QualityMetric=s(0)−MinMetric.

The above mentioned 3GPP metric is defined in 3GPP TS 25.212 Appendix A as:

$$3GPPmetric = \frac{s(0) - MinMetric}{MaxMetric - MinMetric}$$

Figure 5:
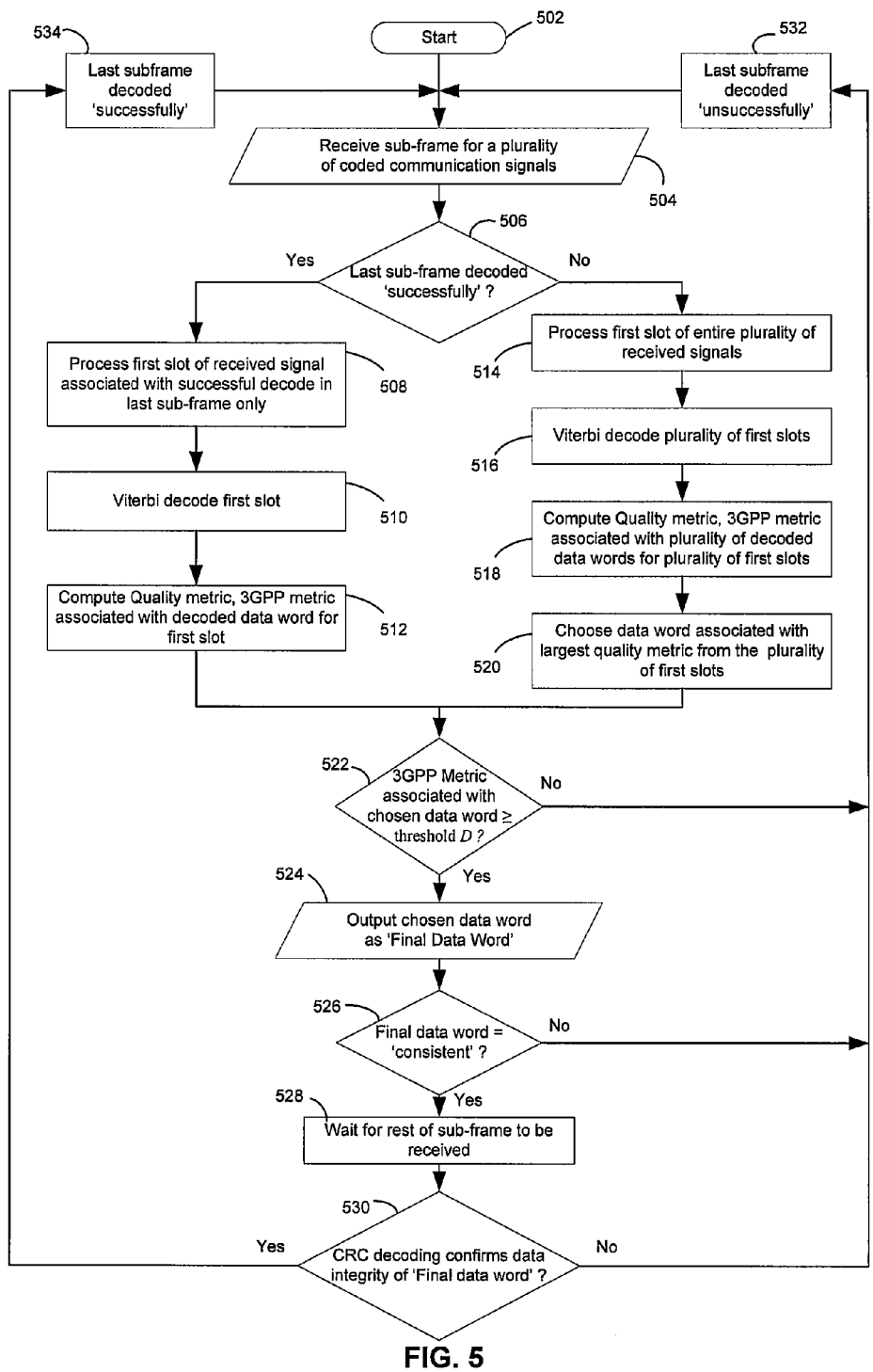
FIG. 5 is a flow diagram illustrating exemplary steps for processing High-Speed Shared Control Channels, in accordance with an embodiment of the invention.

FIG. 5 is a flow diagram illustrating exemplary steps for processing High-Speed Shared Control Channels, in accordance with an embodiment of the invention. Referring to FIG. 5, in step 504, a plurality of HS-SCCH channels is received. This corresponds to the maximum of 4 HS-SCCH input branches shown in FIG. 3 entering the Un-masking blocks 302, 312, 322 and 332. In step 506, it may be determined whether the last sub-frame has been decoded successfully, whereby last sub-frame indicates a sub-frame that may have been processed immediately preceding currently processed sub-frame. The conditions, which define successful decoding, are presented below with the explanation of steps 526 to 534. If the last sub-frame has been decoded successfully, it is not necessary to process the plurality of HS-SCCH of a maximum of four HS-SCCH. Instead, it may suffice to process the HS-SCCH that was successfully decoded in the last sub-frame.

If the last sub-frame was found to have been decoded unsuccessfully in step 506, the plurality of HS-SCCH first slots may be processed in block 514. In step 514 comprises of Un-masking and Un-puncturing, as shown in FIG. 3. The plurality of signals is then fed into a plurality of Viterbi decoders in block 516. In step 516 corresponds to the Viterbi decoding blocks 306, 316, 326 and 336 in FIG. 3, respectively. For the plurality of decoded data words resulting from the plurality of Viterbi decoders, the 3GPP metric and the quality metric may be computed as described for FIG. 4 in block 518, in accordance with an embodiment of the invention. In Block 520, the data word associated with the largest quality metric obtained in 518 may be selected.

Alternatively, if the last sub-frame was found to have been decoded successfully in step 506, the HS-SCCH that was successfully decoded in the last sub-frame may be processed The remaining HS-SCCH will not have to be decoded. Hence, the first slot of the HS-SCCH that was successfully decoded in the last sub-frame, is Un-masked and Un-punctured in step 508. In step 508 corresponds to the Un-masking and Un-puncturing operations shown in FIG. 3. In step 510, the resulting signal is Viterbi decoded. This corresponds to the Viterbi decoding block in FIG. 3. The 3GPP metric and the quality metric associated to the decoded data word may be computed in step 512. Since, only one signal was processed due to successful decoding in the last frame, no comparison between different quality metrics associated with different HS-SCCH needs to be performed.

In step 522, the 3GPP metric associated with the selected data word may be compared to a threshold D, where D is a design parameter, as described for FIG. 3. If the value of the 3GPP metric exceeds or is equal to the threshold D, the HS-SCCH from which the decoded data word was obtained may be assumed to have been present and the data word is output as the final data word. This corresponds to the output of block 340 in FIG. 3. If the 3GPP metric is less than the threshold D, it may be assumed that no HS-SCCH carrying data for the UE was present and the data word may be rejected, as described for FIG. 3. In this case, the sub-frame decoding may be declared unsuccessful in block 532 and the decoding process starts afresh with the next sub-frame at step 504.

In step 526, the final data word may be checked for consistency substantially as defined in 3GPP TS 25.214, Appendix 6A. Referring to 3GPP TS 25.214, control information may be considered to be consistent if the decoded channelization-code-set information is lower than or equal to maximum number of HS-DSCH codes received in its UE capability. Notwithstanding, control information may be considered to be consistent if the decoded modulation scheme is valid in terms of its UE capability.

According to 3GPP TS 25.214, if the UE detects consistent information in the sub-frame that is processed, it may be sufficient in the immediately succeeding sub-frame to decode only the HS-SCCH from which the consistently decoded data word has been obtained. The other HS-SCCH may not need to be decoded.

However, it may occur that the data decoded in the first slot appears consistent according to the definition in 3GPP TS 25.214 but contains errors. This may be possible because the error-correction capability of the first slot of the HS-SCCH sub-frame processed in isolation from timeslots 2 and timeslot 3 may be comparatively weak because the first timeslot needs to be processed very quickly to setup reception of the HS-PDSCH. Since all three timeslots of a sub-frame are also encoded together with a cyclic redundancy check (CRC) code, according to 3GPP TS 25.212, Section 4.6, it may be possible to verify the data integrity of the first slot to a much higher degree of certitude by processing the CRC after the entire sub-frame has been received. Hence, the decision whether to process the plurality of HS-SCCH or only the HS-SCCH successfully decoded in the last sub-frame, may be made with a much higher level of confidence if consistency and the CRC decode are combined. A higher probability of correct decisions regarding the processing of a single HS-SCCH only provides improved data throughput performance of the HS-PDSCH.

Therefore, in step 526, if the final word is found to be inconsistent, the data word need not be processed further and the decoding of the sub-frame may be declared unsuccessful in step 532 and the decoding process may start afresh in step 504. If the final data word is found to be consistent, the final data word may be kept and waits for the timeslots 2 and 3 of the sub-frame to be received, as shown in step 528. After all three timeslots of the sub-frame have been received, the data integrity of the final data word may be confirmed through the CRC decode in step 530. If the CRC confirms the integrity of the final data word, the decoding of the sub-frame may be declared successful in step 534 and the decoding may start afresh with the next sub-frame at step 504. If the CRC finds the final data word to be erroneous, the decoding of the sub-frame may be declared unsuccessful in step 532 and the decoding starts afresh with the next sub-frame at step 504.

In accordance with an embodiment of the invention, a method and system for UMTS HSDPA Shared Control Channel processing may comprise calculating at a receiver, as shown in FIG. 3, for each one of a plurality of control channels, a corresponding plurality of quality metrics, derived from a corresponding plurality of Viterbi Decoder state metrics for each of said plurality of control channels. The Viterbi decoders are shown as blocks 306, 316, 326 and 336 for HS-SCCH0, HS-SCCH1, HS-SCCH2 and HS-SCCH3, respectively and the state metrics are illustrated in FIG. 4. In decision step 340, one of the plurality of control channels is selected based on the quality metrics output from blocks 306, 316, 326 and 336 to the decision block 340. The control channel that will be selected may be associated with the quality metric that provides maximum confidence in the associated decoded word.

As shown in block 522 in FIG. 5, the selected control channel is selected only if its corresponding 3GPP metric is greater than a specified threshold D. The threshold D used in step 522 is a design parameter. The obtained final data word and the correspondingly selected control channel may be checked for validity in step 530, based on the CRC. The CRC used in step 530 may be derived from decoding all three slots of a sub-frame, as shown in FIG. 2. The system shown in FIG. 3, processes only the first slot of the sub-frame to calculate the metrics and select the control channel. The plurality of control channels of the system depicted in FIG. 2, FIG. 3 and FIG. 5 comprise of High-Speed Shared Control Channels.

Another embodiment of the invention may provide a machine-readable storage, having stored thereon, a computer program having at least one code section executable by a machine, thereby causing the machine to perform the steps as described above for UMTS HSDPA Shared Control Channel processing.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communication system, the method comprising:
    calculating at a receiver, for each one of a plurality of control channels, a quality metric derived from at least one Viterbi Decoder state metric; and
    selecting one of said plurality of control channels based on a selected one of said calculated quality metrics.

2. The method according to claim 1, wherein said selected one of said calculated quality metrics provides maximum confidence that said selected one of said plurality of control channels comprises desired data.

3. The method according to claim 1, wherein said selected one of said plurality of control channels is chosen if its corresponding 3GPP metric is greater than a specified threshold.

4. The method according to claim 3, wherein said specified threshold is a design parameter.

5. The method according to claim 1, comprising determining a validity of said selected one of said plurality of control channels based on consistency and a CRC.

6. The method according to claim 5, wherein said CRC is derived from decoding a sub-frame.

7. The method according to claim 1, wherein said calculating and said selecting are done for a first slot of a sub-frame.

8. The method according to claim 1, wherein said plurality of control channels comprise High-Speed Shared Control Channels.

9. A system for processing signals in a communication system, the system comprising:
    one or more circuits that calculate at a receiver, for each one of a plurality of control channels, a quality metric derived from at least one Viterbi Decoder state metric; and
    said one or more circuits select one of said plurality of control channels based on a selected one of said calculated quality metrics.

10. The system according to claim 9, wherein said selected one of said calculated quality metrics provides maximum confidence that said selected one of said plurality of control channels comprises desired data.

11. The system according to claim 9, wherein said selected one of said plurality of control channels is chosen if its corresponding 3GPP metric is greater than a specified threshold.

12. The system according to claim 11, wherein said specified threshold is a design parameter.

13. The system according to claim 9, comprising determining a validity of said selected one of said plurality of control channels based on consistency and a CRC.

14. The system according to claim 13, wherein said CRC is derived from decoding a sub-frame.

15. The system according to claim 9, wherein said calculating and said selecting are done for a first slot of a sub-frame.

16. The system according to claim 9, wherein said plurality of control channels comprise High-Speed Shared Control Channels.

17. A machine-readable storage having stored thereon, a computer program having at least one code section for processing signals in a communication system, the at least one code section being executable by a machine for causing the machine to perform steps comprising:
    calculating at a receiver, for each one of a plurality of control channels, a quality metric derived from at least one Viterbi Decoder state metric; and
    selecting one of said plurality of control channels based on a selected one of said calculated quality metrics.

18. The machine-readable storage according to claim 17, wherein said selected one of said calculated quality metrics provides maximum confidence that said selected one of said plurality of control channels comprises desired data.

19. The machine-readable storage according to claim 17, wherein said selected one of said plurality of control channels is chosen if its corresponding 3GPP metric is greater than a specified threshold.

20. The machine-readable storage according to claim 19, wherein said specified threshold is a design parameter.

21. The machine-readable storage according to claim 17, wherein said at least one code section determines a validity of said selected one of said plurality of control channels based on consistency and a CRC.

22. The machine-readable storage according to claim 21, wherein said CRC is derived from decoding a sub-frame.

23. The machine-readable storage according to claim 17, wherein said calculating and said selecting are done for a first slot of a sub-frame.

24. The machine-readable storage according to claim 17, wherein said plurality of control channels comprise High-Speed Shared Control Channels.

* * * * *